(12) United States Patent
Roeters et al.

(10) Patent No.: US 6,573,460 B2
(45) Date of Patent: Jun. 3, 2003

(54) POST IN RING INTERCONNECT USING FOR 3-D STACKING

(75) Inventors: Glen E. Roeters, Huntington Beach, CA (US); Frank E. Mantz, Hawthorne, CA (US)

(73) Assignee: DPAC Technologies Corp, Garden Grove, CA (US)

( * ) Notice: Subject to any disclaimer, the term of this patent is extended or adjusted under 35 U.S.C. 154(b) by 0 days.

(21) Appl. No.: 09/957,190

(22) Filed: Sep. 20, 2001

(65) Prior Publication Data

US 2003/0051906 A1 Mar. 20, 2003

(51) Int. Cl.⁷ .......................... H01R 12/04; H05K 1/11
(52) U.S. Cl. ............................ 174/262; 174/261
(58) Field of Search ............................ 174/262, 263, 174/264, 265, 261; 361/767, 768, 777; 439/69, 91; 257/737, 778

(56) References Cited

U.S. PATENT DOCUMENTS

| | | |
|---|---|---|
| 3,316,455 A | 4/1967 | Hucke, III |
| 3,340,439 A | 9/1967 | Henschen et al. |
| 3,370,203 A | 2/1968 | Kravitz et al. |
| 3,437,882 A | 4/1969 | Cayzer |
| 3,529,213 A | 9/1970 | Farrand et al. |
| 3,723,977 A | 3/1973 | Schaufele |
| 3,746,934 A | 7/1973 | Stein |
| 4,371,912 A | 2/1983 | Guzik |
| 4,502,098 A | 2/1985 | Brown et al. |
| 4,638,348 A | 1/1987 | Brown et al. |
| 4,761,681 A | 8/1988 | Reid |
| 4,823,233 A | 4/1989 | Brown et al. |
| 4,833,568 A | 5/1989 | Berhold |
| 4,841,355 A | 6/1989 | Parks |
| 4,851,695 A | 7/1989 | Stein |
| 4,868,712 A | 9/1989 | Woodman |

(List continued on next page.)

FOREIGN PATENT DOCUMENTS

| | | |
|---|---|---|
| JP | 56-88324 | 7/1981 |
| JP | 59194460 | 11/1984 |
| JP | 60-191518 | 10/1985 |
| JP | 62016535 | 1/1987 |
| JP | 62293749 | 12/1987 |
| JP | 1289190 | 11/1989 |
| JP | 2144986 | 6/1990 |
| JP | 2-239651 | 9/1990 |
| JP | 3255656 | 11/1991 |

OTHER PUBLICATIONS

Kenneth Mason Publications, Ltd. England; "Organic Card Device Carrier"; May 1990; No. 313.

Quadrant Technology, Inc.; "Megabyte per Cubic Inch"; May 1988.

John Wiley & Sons, Inc.; "VLSI Fabrication Principles—Silicon and Gallium Arsenide"; Sorab K. Ghandi, 1994.

*Primary Examiner*—Albert W. Paladini
*Assistant Examiner*—Jeremy Norris
(74) *Attorney, Agent, or Firm*—Stetina Brunda Garred & Brucker

(57) ABSTRACT

A post in ring interconnect used for 3-D stacking. A retaining ring is formed on a pad on a bottom surface of a top PCB substrate to be stacked with a bottom PCB substrate. A post is formed on a pad on a top surface of the bottom PCB substrate. A conductive paste is applied on the pad on the bottom surface of the top PCB substrate and retained in a pocket partially defined by the retaining ring. The retaining ring is aligned with the post. By performing a compression step, a eutectic bond is formed between the top and bottom PCB substrates by the post and the conductive paste.

9 Claims, 3 Drawing Sheets

U.S. PATENT DOCUMENTS

| | | |
|---|---|---|
| 4,956,694 A | 9/1990 | Eide |
| 5,016,138 A | 5/1991 | Woodman |
| 5,128,831 A | 7/1992 | Fox et al. |
| 5,198,888 A | 3/1993 | Sugano et al. |
| 5,201,451 A | 4/1993 | Desai et al. |
| 5,231,304 A | 7/1993 | Solomon |
| 5,239,447 A | 8/1993 | Cotues et al. |
| 5,269,453 A | 12/1993 | Melton et al. |
| 5,282,565 A | 2/1994 | Melton |
| 5,284,796 A | 2/1994 | Nakanishi |
| 5,311,401 A | 5/1994 | Gates et al. |
| 5,313,096 A | 5/1994 | Eide |
| 5,324,569 A | 6/1994 | Nagesh et al. |
| 5,328,087 A | 7/1994 | Nelson et al. |
| 5,343,075 A | 8/1994 | Nishino |
| 5,362,986 A | 11/1994 | Angiulli |
| 5,373,189 A | 12/1994 | Massit et al. |
| 5,375,041 A | 12/1994 | McMahon |
| 5,376,825 A | 12/1994 | Tukamoto et al. |
| 5,384,689 A | 1/1995 | Shen |
| 5,397,916 A | 3/1995 | Normington |
| 5,432,678 A | 7/1995 | Russell et al. |
| 5,466,634 A | 11/1995 | Beilstein |
| 5,471,368 A | 11/1995 | Downie et al. |
| 5,481,134 A | 1/1996 | Sobhani et al. |
| 5,514,907 A | 5/1996 | Moshayedi |
| 5,561,593 A | 10/1996 | Rotolante |
| 5,607,538 A | 3/1997 | Cooke |
| 5,612,570 A | 3/1997 | Eide et al. |
| 5,625,221 A | 4/1997 | Kim et al. |
| 5,637,536 A | 6/1997 | Wal |
| 5,677,569 A | 10/1997 | Choi |
| 5,700,715 A | 12/1997 | Pasch |
| 5,705,858 A * | 1/1998 | Tsukamoto |
| 5,759,046 A | 6/1998 | Ingraham et al. |
| 5,776,797 A | 7/1998 | Nicewarner |
| 5,818,106 A | 10/1998 | Kunimatsu |
| 5,834,843 A | 11/1998 | Mori et al. |
| 5,857,858 A | 1/1999 | Gorowitz et al. |
| 5,869,353 A | 2/1999 | Levy et al. |
| 5,869,896 A | 2/1999 | Baker et al. |
| 5,926,369 A | 7/1999 | Ingraham et al. |
| 5,929,521 A * | 7/1999 | Wark et al. |
| 5,930,603 A | 7/1999 | Tsuji et al. |
| 5,950,304 A | 9/1999 | Khandros et al. |
| RE36,325 E | 10/1999 | Corbett et al. |
| 5,994,166 A | 11/1999 | Akram et al. |
| 6,002,172 A * | 12/1999 | Desai et al. |
| 6,014,316 A | 1/2000 | Eide |
| 6,057,381 A | 5/2000 | Ma et al. |
| 6,075,800 A * | 6/2000 | Spear |
| 6,137,184 A * | 10/2000 | Ikegami |
| 6,172,874 B1 | 1/2001 | Bartilson |
| 6,188,127 B1 | 2/2001 | Senba et al. |
| 6,222,737 B1 | 4/2001 | Ross |
| 6,262,895 B1 | 7/2001 | Forthun |
| 6,329,609 B1 * | 12/2001 | Kaja et al. |
| 6,384,343 B1 * | 5/2002 | Furusawa |

* cited by examiner

POST IN RING INTERCONNECT USING FOR 3-D STACKING

BACKGROUND OF THE INVENTION

The present invention relates generally to chip stacks, and more particularly to a 3-D chip stack with a post in ring interconnect.

As is currently known in the art, packaged components are often stacked using a variety of approaches. In all of the approaches to date, the concept has been for the end user to mount the stacks on the surface of a solid board such as a printed circuit board (PCB). More particularly, one of the most commonly used techniques to increase memory capacity is the stacking of memory devices into a vertical chip stack, sometimes referred to as 3D packaging or Z-Stacking. In the Z-Stacking process, from two to as many as eight memory devices or other integrated circuit (IC) chips are interconnected in a single component (i.e., a chip stack) which is mountable to the "footprint" typically used for a single packaged device such as a packaged chip. The Z-Stacking process has been found to be volumetrically efficient, with packaged chips in TSOP (thin small outline package) or LCC (leadless chip carrier) form generally being considered to be the easiest to use in relation thereto. Though bare dies may also be used in the Z-Stacking process, such use tends to make the stacking process more complex and not well suited to automation.

In the 3-D stacking process, a solder bridge is typically applied to interconnect neighboring layers or PCB substrates that carry IC devices. However, in the ever changing world of electronics, smaller, faster, and more functionality are always requested. Shrinkage of devices generally results in more I/O's in a smaller package. Design rules are requiring shorter signal paths to accommodate the faster die speeds. With the tighter pitches becoming more prominent in the packages, solder bridging between neighboring interconnects becomes more difficult to control. This forces the issue of eliminating solder paste because of its limitation on density. Another concern relates to environmental issues with the lead content in solder and the disposal thereof. A method to resolve these problems is required.

SUMMARY OF THE INVENTION

The invention provides a post in ring interconnection to replace the solder joints between neighboring substrates or layers for stacking IC devices, such that the limitation in density and environmental problems caused by lead content attendant to the use of solder paste are eliminated.

A first PCB substrate is provided with conductive pads on two opposing surfaces thereof. The two conductive pads are electrically connected to each other by a via through the PCB substrate. A retaining ring is plated on a peripheral portion of one of the conductive pads of the first PCB substrate, so that a pocket or recess is formed within the retaining ring. A second PCB substrate is provided, again, with two conductive pads on two opposing surfaces thereof. A post is disposed on a center portion of one of the conductive pads of the second PCB substrate. When the first PCB substrate is stacked with the second PCB substrate, the conductive pad with the retaining ring is aligned with the conductive pad with the post. In addition, a conductive paste or ink is applied into the pocket. In this way, the post is received in the pocket and connected to the conductive pad of the first PCB substrate. By a lamination process, a eutectic bond is formed of the conductive paste between the two adjoining pads of the two PCB substrates.

In addition, an adhesive is applied between the adjoining surfaces of the first and the second PCB substrates. Using a lased or drilled technique, the post is inserted into the adhesive and aligned on the conductive pad of the second PCB substrate. In the reflow process, the adhesive reflows to create a tight bond between the first and the second PCB substrates.

BRIEF DESCRIPTION OF THE DRAWINGS

These, as well as other features of the present invention, will become more apparent upon reference to the drawings wherein.

DETAILED DESCRIPTION OF THE INVENTION

Figure 1:
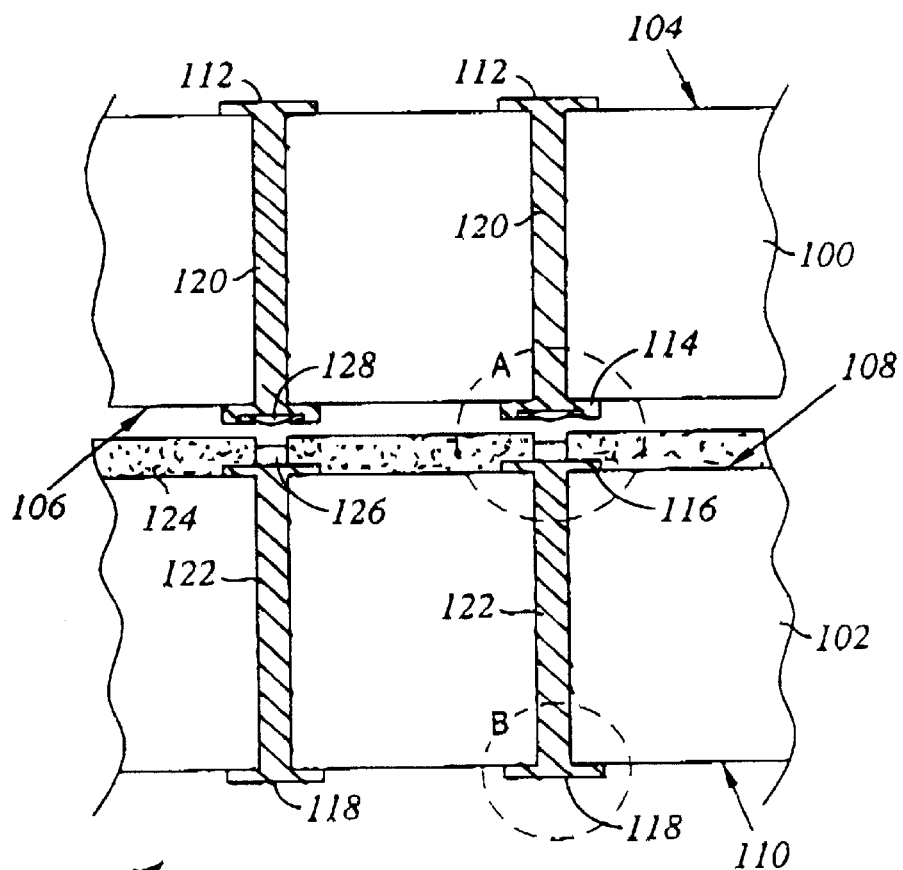
FIG. 1 is a side view of two substrates stacked together using the post in ring interconnect provided in the present invention.
Figure 2:
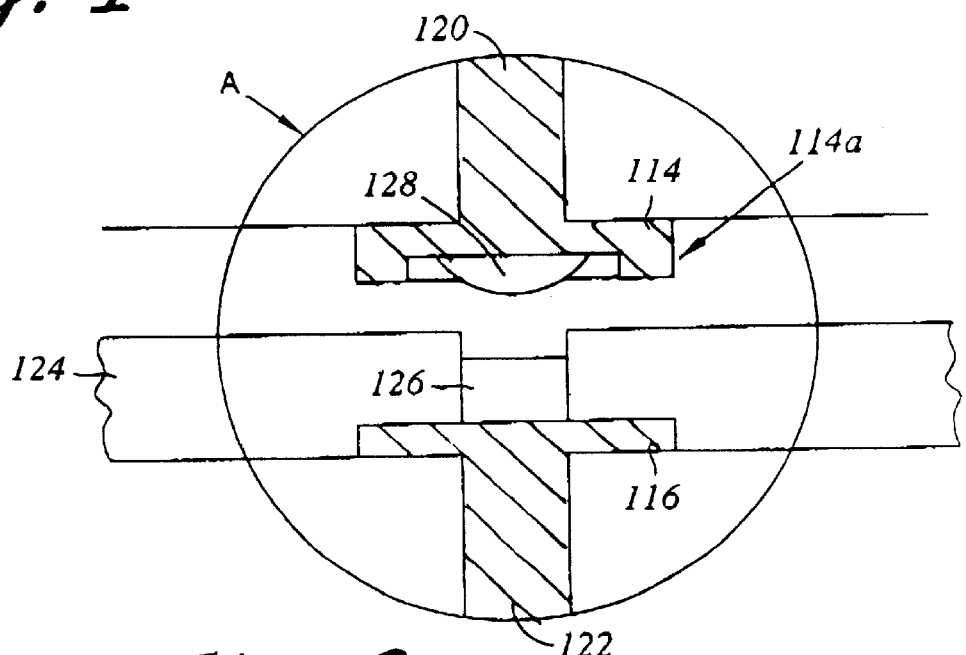
FIG. 2 is an enlarged view of the encircled region A of FIG. 1 showing the post in ring interconnect before being compressed.

FIG. 1 shows two substrates 100 and 102 to be stacked with each other. The substrate 100 has a top surface 104 and a bottom surface 106, and the substrate 102 has a top surface 108 and a bottom surface 110. Pads 112 and 114 are formed on the top surface 104 and the bottom surface 106, respectively, of the substrate 100. The pads 112 and 114 on two opposing surfaces 104 and 106 of the substrate 100 are electrically connected to each other by the formation of a conductive via 120. Similarly, pads 116 and 118 are formed on the top surface 108 and the bottom surface 110, respectively, of the substrate 102. The pads 116 and 118 on two opposing surfaces 108 and 110 of the substrate 102 are electrically connected to each other by the formation of a conductive via 122 through the substrate 102. The pads 114 on the bottom surface 106 are each processed with a plated retaining ring 114a (FIG. 2). A pocket or recess is thus formed on the pad 114 and partially defined by the retaining ring 114a. A conductive paste or ink 128 is filled into the pocket.

In addition to each of the pads 114 being processed to include a plated retaining ring 114a, each of the pads 116 is processed to include a plated post 126. In the preferred embodiment, the retaining ring 114a of each pad 114 is made of the same material as the pad 114, e.g., copper. Similarly, each plated post 126 is also preferably formed of copper which is the same material preferably used to form the corresponding pad 116.

An adhesive layer 124 is applied on the top surface of the PCB substrate 102. As shown in FIGS. 1 and 2, a lased or drilled hole is formed in the adhesive layer 124 in alignment with each pad 116 formed thereon. Each lased or drilled hole is sized and configured to accommodate a respective one of the posts 126. In this regard, as shown in FIG. 2, the post 126 inserted or advanced into the adhesive layer 124 has a height smaller than that of the adhesive layer 124. The alignment of the adhesive layer 124 with the substrate 102 may be accomplished through the use of tooling holes and pins. Preferably, the material for forming the adhesive layer 124 is selected from one of the materials including polyester, epoxy, acrylic, phenolic/butyral and polyimide.

FIG. 2 shows an enlarged side view of the encircled region A of FIG. 1. In FIG. 2, the retaining ring 114a is formed on the pad 114. In one embodiment of the invention, the pads 114 including the retaining rings 114a have a total height of about 0.001 inches. Of this height, about 0.0005 inches is attributable to the retaining ring 114a, i.e., the central portion of the pad 114 also has a height or thickness of about 0.0005 inches. As such, the recess or pocket defined by each of the pads 114 has a depth of about 0.0005 inches. The inner and outer diameters of the retaining ring 114a are preferably about 0.0006 inches and 0.0008 inches, respectively. Further, the diameter of the post 126 is preferably smaller than that of the pocket partially defined by the retaining ring 114a.

Figure 3:
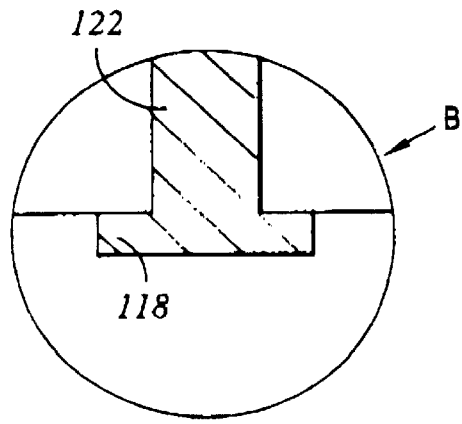
FIG. 3 is enlarged view of the encircled region B of FIG. 1 showing the pad on a distal surface opposed to the adjoining surface of one of the substrates.

Each of the pads 116 which does not include a retaining ring has a preferred height or thickness in the range of about 0.0005 inches to about 0.0007 inches, and is preferably made of the same material as the pads 114 and retaining rings 114a, e.g., copper. The pads 112 on the top surface 104 and pads 118 on the bottom surface 110 are also preferably formed of copper in the same dimensional range as each of the pads 116. An enlarged view of the pad 118 on the bottom surface 110 of the substrate 102 is shown in FIG. 3. Those of ordinary skill in the art will recognize that the various dimensions described above are only given by way of example in relation to the present invention. In this regard, these parameters may be altered according to specific requirements.

Figure 4:
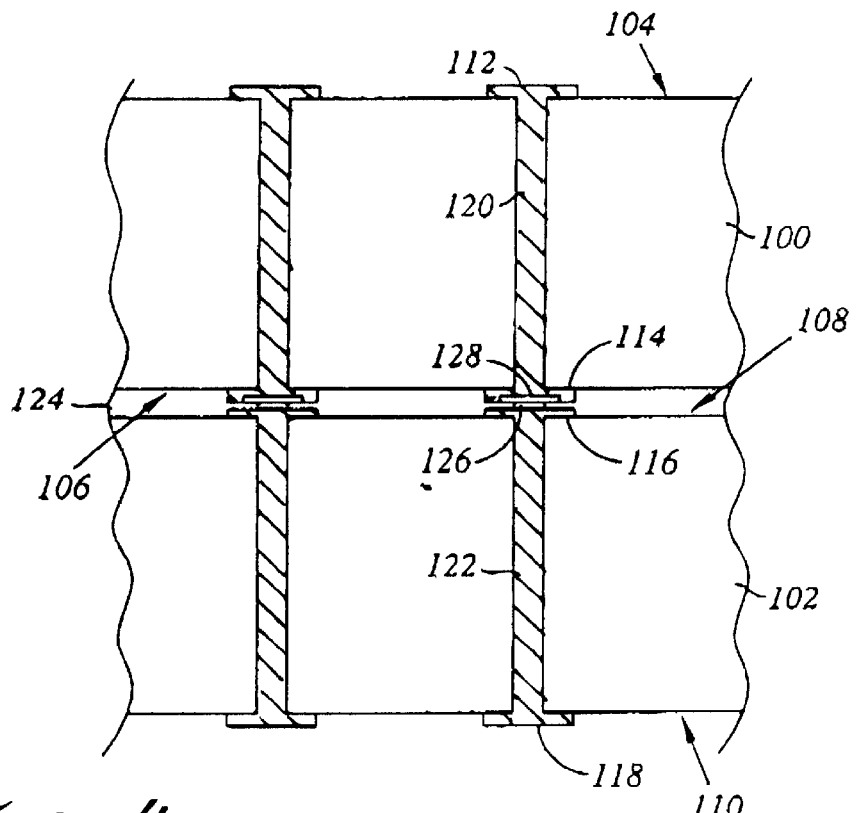
FIG. 4 shows the stacked substrates after compression.

FIG. 4 shows the stacked structure of the substrates 100 and 102 after compression. Referring to FIG. 1, once the post 126 is aligned with the pocket partially defined by the retaining ring 114a, and the conductive paste 128 is applied within the pocket, a compression step is performed. Tooling pins can be used for the alignment of the retaining ring(s) 114a and the post(s) 126. The compression step such as a reflow process controls the pressure and temperature. As a result, a eutectic bond is formed between the pads 114 and 116, while the adhesive layer 124 reflows to create a tight bond between the surfaces 106 and 108 of the PCB substrates 100 and 102.

Figure 5:
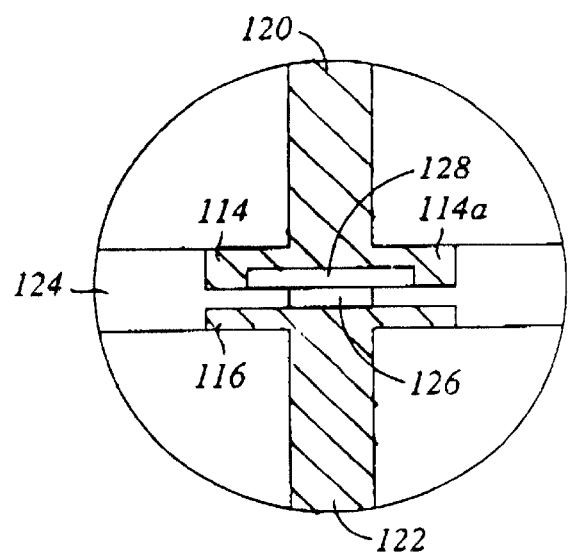
FIG. 5 is an enlarged view of the encircled region C shown in FIG. 4.

FIG. 5 shows the enlarged view of the pad 114 with the retaining ring 114a, the post 126, and the conductive paste 128 after compression. After compression, a eutectic bond is formed of the post 126 and the conductive paste 128 to connect the pads 114 and 116 by controlling pressure and temperature. Again, the adhesive layer 124 reflows to tightly bond the PCB substrates 100 and 102.

The technique of post in ring interconnection can be applied between layers in a 3-D stacking approach. The retaining ring is used to greatly enhance the assembly process for achieving higher densities. The stacking approach enables the stacking of IC devices, one on top of the other, with vertical as well as horizontal interconnections. Each device or a plurality of devices is attached to a component carrier, also termed a base. The I/O's of each component carrier are terminated in pads located around the perimeter thereof. A frame comprising matching perimeter pads and feed through holes connecting top and bottom pads is placed between component carrier layers. The bottom component carrier translates the stack to route the I/O's to the appropriate pattern. The layers (component carrier, frame, and the component carrier I/O) are then interconnected using the post in ring technique.

Figure 6:
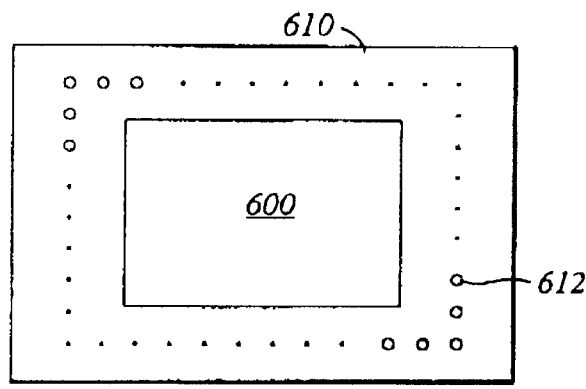
FIG. 6 is a top view of a component carrier, on which an IC device is attached.

FIG. 6 shows an example of the component carrier layer mentioned above. As shown in FIG. 6, an IC device 600 is attached on a component carrier 610. The component carrier 610 has a plurality of perimeter pads 612 formed around the IC device 600. As mentioned above, the I/O's are routed and terminated at the perimeter pads 612.

Figure 7:
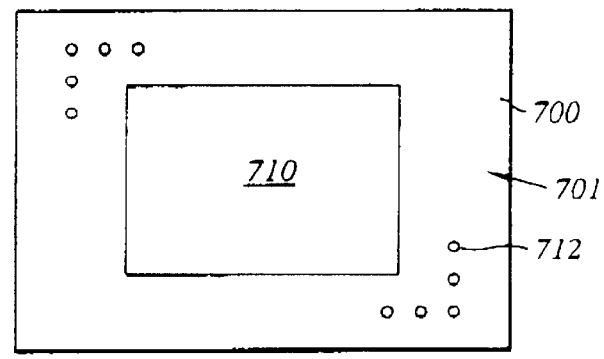
FIG. 7 is a top view of a frame to over fit the component carrier as shown in FIG. 7.
Figure 8:
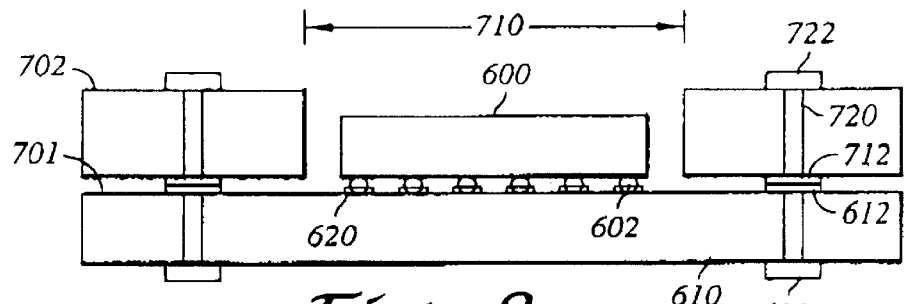
FIG. 8 is a side view of the layer to be stacked with the over, on which a retaining ring is formed.

FIG. 7 shows a frame 700, of which a surface 701 is provided with a plurality of pads 712. Each of the pads 712 on the surface 701 is designed to match a respective one of the perimeter pads 612 on the component carrier 610. On the other surface 702 opposed to the surface 701, a plurality of pads 722 are formed. Each of the pads 722 is electrically connected to a corresponding one of the pads 712 on the surface 701 through a conductive via 720. As shown in FIG. 8, the frame 700 is engageable to the component carrier 610 with the IC device 600 accommodated in the opening 710 defined by the frame 700. When a ball grid array (BGA) device is used as the IC device 600, the electrical connections between the IC device 600 and the component carrier 610 are achieved by the ball grid array 602 and a pad array 620. Traces are configured to redirect the pad array 620 to the perimeter pads 612.

The IC device 600 carried by the component carrier 610 may include a BGA device, a TSOP (thin, small outline package) device, a flip chip device, a chip scale package (CSP), a microBGA ($\mu$BGA) device, or even a bare die. Alternatively, more than one of the above IC devices may be intermixed on the component carrier 600. When the frame 700 overfits the component carrier 710, the pads 712 and 612 are aligned and electrically connected to each other. Preferably, the post in ring structure is applied on the pads 712 and 612 instead of using conventional solder. Thus, retaining rings may be formed on either the pads 712 or the pads 612. Further, retaining rings may also be formed on the pads 722 and 622 on distal surfaces of the frame 700 and the component carrier 610 for further connection or stacking using the post in ring technique.

Further, when panels, for example, the typical 4"×6" panels with multiple stack sites, are processed and stacked in a stacking fixture and cured with heat and pressure such as provided by a vacuum lamination press, the retaining rings can be applied. During the lamination cycle, the conductive paste forms a eutectic bond between each post and the corresponding pad including the retaining ring. At this time the adhesive also reflows to create a tight bond from layer to layer. Once cured, the conductive paste will not reflow at temperatures above 200° C.

The post in ring interconnect replacing the solder bridge makes a finer pitch more possible and practical. A lower processing temperature is required compared to that required for the conventional solder process, therefore, less potential damage is caused to the IC components. Using the conductive paste for the eutectic bond, there is no post assembly cleaning required. Further, as it can be easily produced in panel format, the producibility is increased.

Indeed, each of the features and embodiments described herein can be used by itself, or in combination with one or more other features and embodiments. Thus, the invention is not limited by the illustrated embodiment but is to be defined by the following claims when read in the broadest reasonable manner to preserve the validity of the claims.

What is claimed is:

1. A post in ring interconnect, comprising:

two pads disposed on two adjoining surfaces of two stacked substrates, an upper one of the two pads including a peripheral retaining ring which partially defines a pocket, and a lower one of the two pads including a central post, the post being aligned with the retaining ring and being insertable into the pocket; and a conductive paste filled within a pocket defined by the retaining ring of the upper one of the two pads.

2. The post in ring interconnect according to claim 1, further comprising:

an adhesive layer accommodating the post and bonding the two adjoining surfaces of the two substrates.

3. The post in ring interconnect according to claim 1, wherein each of the two substrates has a distal surface including a pad formed thereon and electrically connected to the pad on the surface adjoining the other substrate by a conductive via.

4. The post in ring interconnect according to claim 2, wherein the adhesive is selected from the group consisting of polyester, epoxy, acrylic, phenolic/butyral, and polyimide.

5. The post in ring interconnect according to claim 1, wherein the two pads are formed of copper.

6. The post in ring interconnect according to claim 1, wherein the retaining ring is formed of copper.

7. The post in ring interconnect according to claim 1, wherein the post is formed of copper.

8. The post in ring interconnect according to claim 1, wherein the post has an outer diameter smaller than an inner diameter of the retaining ring.

9. The post in ring according to claim 1 where the post is directly connected to the upper pad.

* * * * *